(12) United States Patent
Taban

(10) Patent No.: US 6,575,229 B1
(45) Date of Patent: Jun. 10, 2003

(54) HEAT SINK HAVING FOLDED FIN HEAT EXCHANGER CORE

(75) Inventor: Vahid Taban, Chino Hills, CA (US)

(73) Assignee: Tandis, Inc., Anaheim, CA (US)

( * ) Notice: Subject to any disclaimer, the term of this patent is extended or adjusted under 35 U.S.C. 154(b) by 0 days.

(21) Appl. No.: 10/228,565

(22) Filed: Aug. 28, 2002

(51) Int. Cl.[7] .................................................. H05K 7/20
(52) U.S. Cl. ...................... 165/80.3; 165/185; 361/697; 361/704
(58) Field of Search .............................. 165/80.3, 185, 165/121; 361/697, 704, 710; 174/16.3; 257/719, 722

(56) References Cited

U.S. PATENT DOCUMENTS

| | | | | | |
|---|---|---|---|---|---|
| 4,777,560 | A | * | 10/1988 | Herrell et al. | 361/694 |
| 5,706,169 | A | * | 1/1998 | Yeh | 361/690 |
| 6,125,921 | A | * | 10/2000 | Kuo | 165/80.3 |
| 6,401,807 | B1 | * | 6/2002 | Wyler et al. | 165/121 |
| 6,401,810 | B1 | * | 6/2002 | Kuo et al. | 165/185 |

* cited by examiner

Primary Examiner—Allen Flanigan
(74) Attorney, Agent, or Firm—Morland C. Fischer

(57) ABSTRACT

A heat exchanger core for a heat sink having a plurality of folded heat conductive fins. Each folded heat conducting fin has a front face, a back face spaced from the front face, a top connected between the front and back faces, open opposite sides that communicate with the atmosphere, and an air intake opening that extends vertically through the top for receipt of a supply of fan blown air. The fins are arranged face-to-face one another to establish laterally extending primary and supplemental air exhaust cavities through the heat exchanger core which run between the vertically extending air intake openings and the open opposite sides of the fins. Thus, the heat exchanger core will have non-linear air flow paths by which heat collected by the plurality of fins is blown into the atmosphere at the open opposite sides thereof. By virtue of the foregoing, the heat exchanger core provides maximum surface area, efficient heat transfer, and optimal air flow so that the heat generated by a source (e.g. a CPU) can be effectively collected and exhausted to the atmosphere.

20 Claims, 5 Drawing Sheets

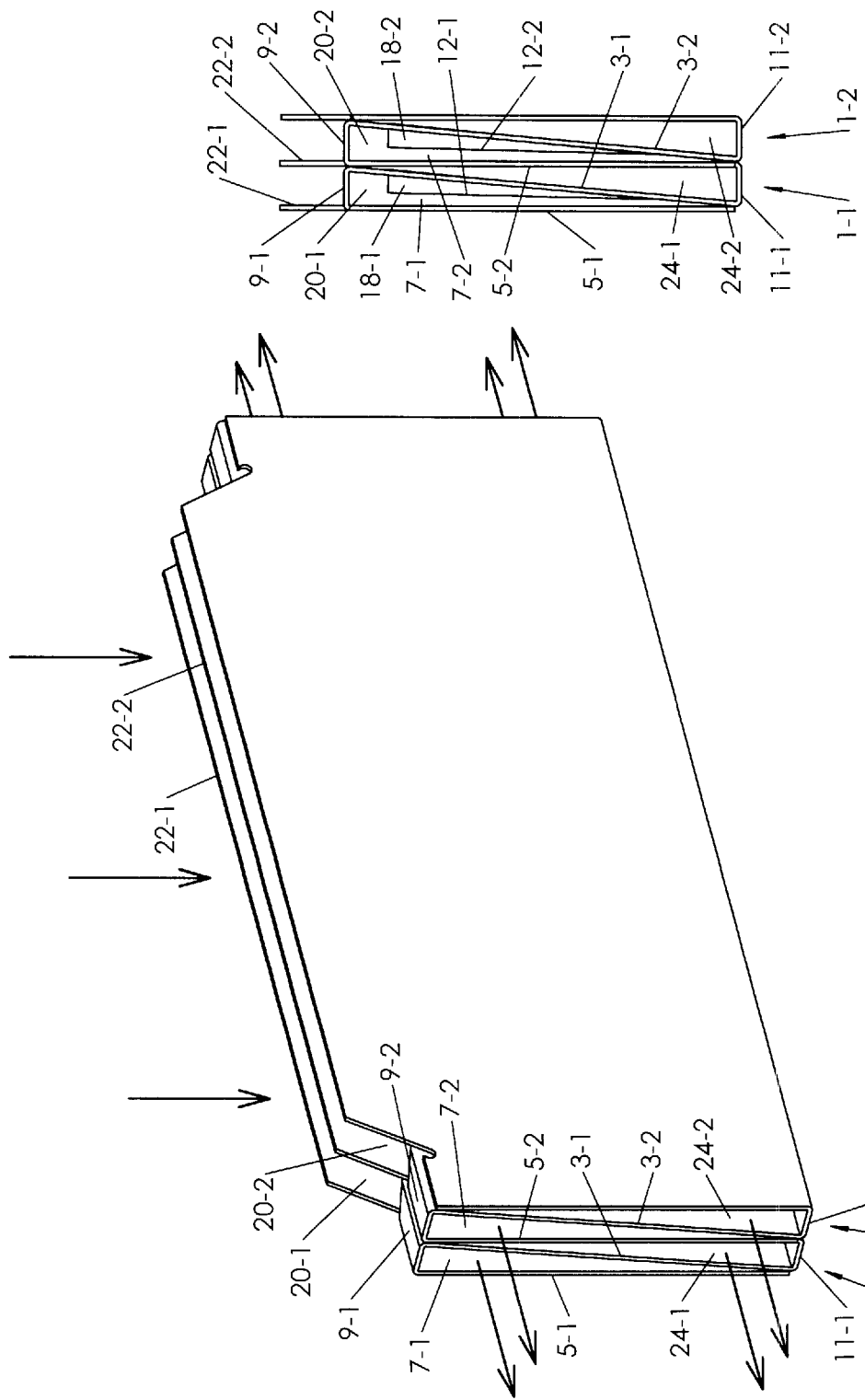

HEAT SINK HAVING FOLDED FIN HEAT EXCHANGER CORE

BACKGROUND OF THE INVENTION

1. Field of the Invention

This invention relates to a high performance folded fin heat exchanger core of the type to be used in a heat sink that is coupled to the CPU of a computing device. The particular folded fin configuration of the heat exchanger core herein disclosed provides maximum surface area, efficient heat transfer, and optimal air flow so that the heat generated by the CPU can be effectively collected and exhausted to the atmosphere.

2. Background Art

Because of the heat that is generated by a central processing unit (CPU) common to personal computers, and the like, and the deleterious effects that may result as a consequence thereof, it is customary to couple a heat sink to the CPU by which the heat generated by the CPU is exhausted to the atmosphere. In fact, as operating speeds continue to increase, the CPU's and their support chips generate increasingly larger amounts of heat. In general, the core of the heat sink consists of a series of thick (e.g. extruded aluminum) heat conducting fins. A fan is positioned at an air intake end of the core to blow air over the fins by which the heat is collected by the fins is exhausted to the atmosphere at an output end of the core.

In the typical heat sink, a relatively long linear air flow path extends between the air intake and output ends of the heat exchanger core. Because of this linear airflow path having the intake and output ends lying opposite one another, it has proven to be difficult to increase the heat conductive surface area of the core without also significantly increasing the size, material consumption and cost thereof. As will be known to those skilled in the art, heat sinks having heat exchanger cores with long linear air flow paths and small heat collecting surface areas are characterized by reduced performance and efficiency. Moreover, because the extruded heat conducting fins are thick, the number of fins that can be accommodated by a heat sink while meeting PC requirements is reduced.

Heat exchanger cores having the aforementioned linear flow path are known to experience a relatively high head pressure at the intake end and a pressure drop between the opposing intake and output ends. To overcome these pressure concerns and maintain a sufficient volume of air flowing through the heat exchanger core, an air delivery system containing air transport conduits is often employed to carry high pressure air from the fan to the air intake end of the core. Such an air delivery system typically consumes space and increases cost and, in some cases, raises the head pressure at the air intake end which may adversely affect the flow rate.

Therefore, what would be desirable is a heat sink for a CPU that contains an efficient heat exchanger core having maximized surface area and minimized space consumption and a relatively short, non-linear air flow path that can accommodate a suitable fan without requiring an intermediate space consuming air delivery system so as to avoid an increase in the head pressure at the air intake end of the core and a reduction in the flow rate through the core.

Examples of known heat sinks to be coupled to a CPU to dissipate the heat that is generated thereby are available by referring to the following United States patents:

| | |
|---|---|
| 5,132,780 | July 21, 1992 |
| 5,706,169 | January 6, 1998 |
| 6,199,624 | March 13, 2001 |
| 6,205,026 | March 20, 2001 |
| 6,241,006 | June 5, 2001 |
| 6,260,610 | July 17, 2001 |
| 6,330,906 | December 18, 2001 |
| 6,330,908 | December 18, 2001 |

SUMMARY OF THE INVENTION

A heat sink is disclosed herein of the type to be coupled to the CPU of a computing device so that the heat generated by the CPU can be effectively and efficiently collected by a high performance folded fin heat exchanger core and exhausted to the atmosphere. Each heat conductive fin of the heat exchanger core is folded to include a front face and a rear face that are spaced from one another and squeezed together at the bottom ends to establish a triangular primary air exhaust cavity. The primary air exhaust cavity runs laterally through the interior of the folded heat conductive fin. As an important detail of this invention, the top of each folded fin is open to create a vertically extending air intake opening which communicates at the interior of the fin with the laterally extending air exhaust cavity. Thus, it may be appreciated that the vertically extending air intake opening and the laterally extending air exhaust cavity are aligned at 90 degrees relative to one another to establish a perpendicular air flow path that runs from the air intake end at the top to the output end at opposite sides of the fin.

An opening is cut into the front face of the fin, and the cut out surface is bent rearwardly along a fold line towards the rear face to create an inner air blade that functions as an air splitter. More particularly, a first portion of the intake air supply is blown downwardly through the vertically extending air intake opening and outwardly from opposite sides of the folded fin via the laterally extending primary exhaust cavity. The remaining portion of the air intake supply is blown downwardly through the air intake opening and into contact with the rearwardly bent inner air blade. The inner air blade splits the intake air supply and diverts the remaining portion thereof into a triangular supplemental air exhaust cavity via the opening that is cut into the front face of the fin to form the inner air blade. The supplemental air exhaust cavity is established between the front face of a first heat conductive fin and the rear face of an adjacent fin.

In this regard, the heat exchanger core for the heat sink of this invention includes a plurality of the aforementioned heat conductive folded fins arranged face-to-face one another, such that generally upper and lower primary and supplemental air exhaust cavities extend laterally through successive pairs of fins. By virtue of the foregoing, the heat exchanger core is characterized by both optimal air flow and about twice the material and heat conductive surface area relative to conventional heat exchanger cores, whereby the thermal characteristics and efficiency of the heat sink is maximized. In the assembled heat sink configuration, a suitable (e.g. muffin) fan is attached to the top of the heat exchanger core so as to blow the intake air supply downwardly into the vertically extending air intake openings of the plurality of face-to-face aligned heat conductive fins. The CPU is coupled to the bottom of the heat exchanger core so that the heat generated by the CPU can be exhausted from opposite sides of the core to the atmosphere via the laterally extending primary and supplemental air exhaust cavities.

BRIEF DESCRIPTION OF THE DRAWINGS

FIG. 4 shows a pair of the folded heat conductive fins aligned face-to-face one another to establish vertically extending air intake openings and laterally extending primary and supplemental air exhaust cavities;

FIG. 5 is a side view of the pair of folded heat conductive fins shown in FIG. 4;

DETAILED DESCRIPTION

Figure 1:
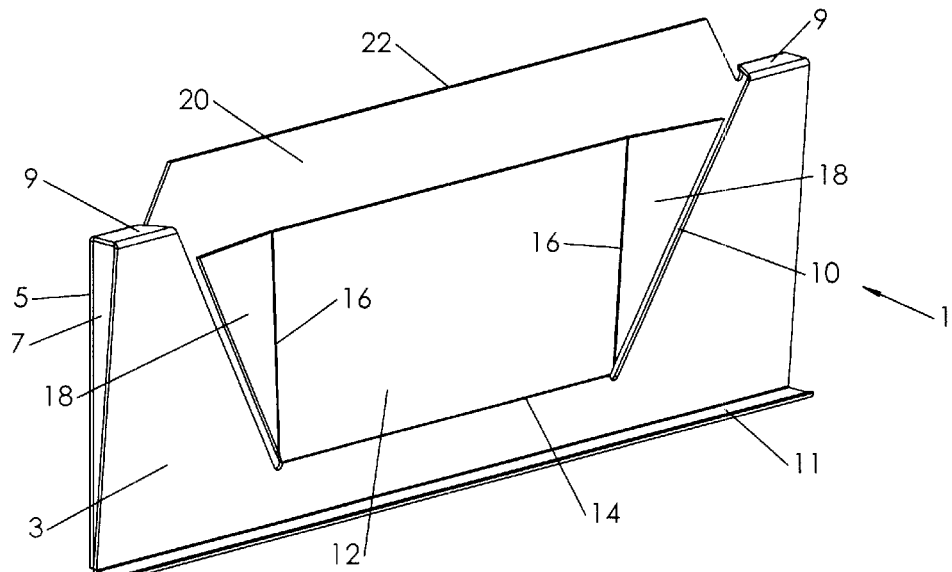
FIG. 1 is a perspective view of a single folded heat conductive fin from the plurality of fins which form the heat exchanger core for the heat sink of the present invention.
Figure 2:
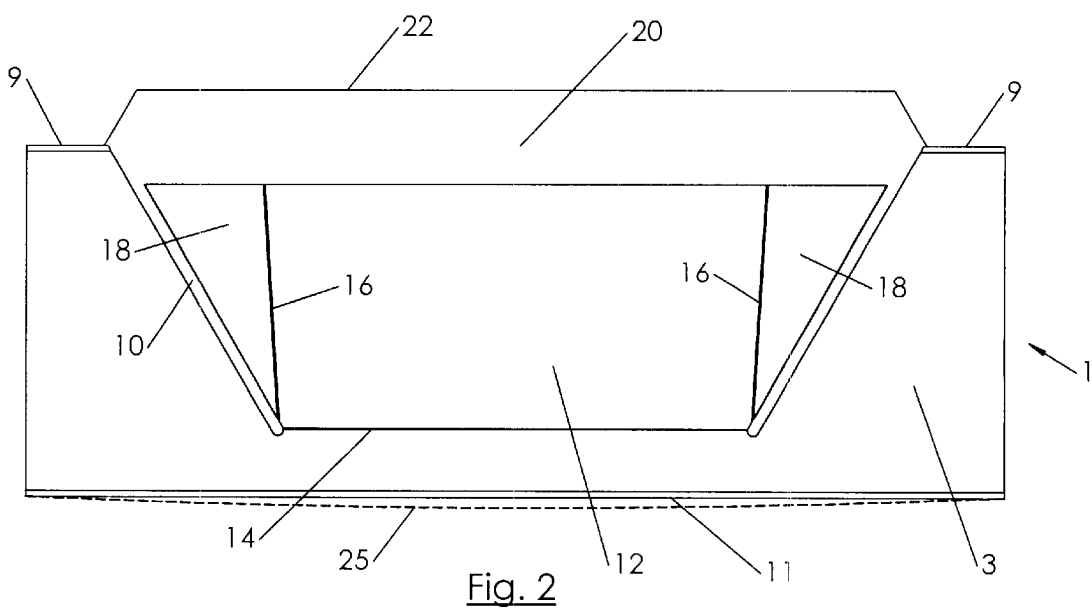
FIG. 2 shows a front view of the folded heat conductive fin of FIG. 1.
Figure 3:
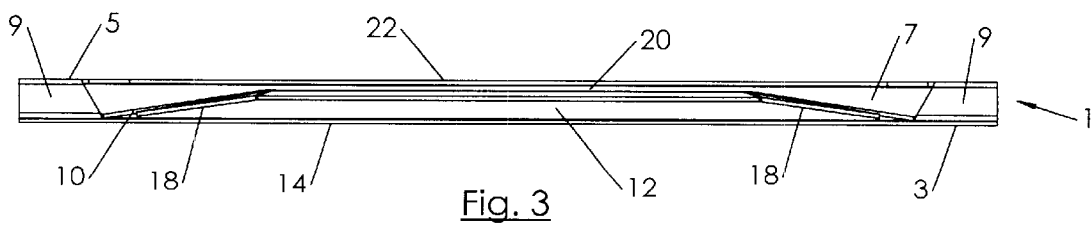
FIG. 3 shows a top view of the folded heat conductive fin of FIG. 1.

Referring initially to FIGS. 1–3 of the drawings, there is shown a single folded heat conductive fin 1 that is but one of a plurality of fins that are assembled face-to-face one another to form an efficient, high performance folded fin heat exchanger core (designated 30 in, FIG. 6) for the heat sink of the present invention. The fins 1 are manufactured from a thermally conductive material such as, copper, aluminum, or the like. Each heat conductive fin 1 has a front face 3 and a rear face 5. The front and rear faces 3 and 5 of fin 1 are spaced from one another to establish therebetween a laterally extending primary air exhaust cavity 7. As is best shown in FIG. 1, the primary air exhaust cavity 7 between the front and rear faces 3 and 5 of fin 1 has a triangular shape. That is to say, pressure is applied by which to bend or squeeze the lower ends of the front and rear faces 3 and 5 together to make a small angle and thereby form two sides of the triangular primary air exhaust cavity 7.

A flat closed portion 9 runs horizontally across the top at each of the opposite sides of fin 1 so as to lie between the upper ends of the front and back faces 3 and 5 and thereby form the third side of the triangular primary air exhaust cavity 7. A flat base 11 turns outwardly from the bottom of the front face 3 of fin 1 for a purpose that will soon be disclosed.

An opening 10 is cut into the front face 3 of the folded heat conductive fin 1. The surface cut from the front face 3 to create the opening 10 is bent rearwardly towards the back face 5 along a fold line 14 so as to form an inner air blade 12 that is positioned within the primary air exhaust cavity 7 of fin 1 in the space between the front and rear faces 3 and 5 thereof. As will be described in greater detail hereinafter when referring to FIGS. 4 and 5, the inner air blade 12 performs the important function of an air splitter or flow diverter for the supply of intake air that is pumped into the heat exchanger core (30 of FIG. 6) by means of a fan. To this end, the angle at which the inner air blade 12 is bent rearwardly towards the back face 5 along the fold line 14 so as to lie within the primary air exhaust cavity 7 will determine the volume of air that is split off from the intake air supply and diverted to a soon to be described supplemental air exhaust cavity via the opening 10 in the front face 3.

The opposite sides of the inner air blade 12 are bent forwardly along fold lines 16 in a direction towards the opening 10 in the front face 3 of the folded heat conductive fin 1 so as to form side flaps 18. The side flaps 18 are bent at an angle so as to focus a portion of the intake air supply that is pumped into the heat sink exchanger core (30 of FIG. 6) against the inner air blade 12 to be more effectively diverted to the supplemental air exhaust cavity (designated 24-1 in FIGS. 4 and 5) via the opening 10 in the front face 3 of fin 1.

As an important detail in the manufacture of the plurality of the folded heat conductive fins that are assembled face-to-face one another to form the heat exchanger core (30 of FIG. 6), an air intake opening 20 (best shown in FIG. 3) is located at the top of each fin 1. The air intake opening 20 through fin 1 is created by means of an outer air blade 22 that projects upwardly from the rear face 5. As will be explained when referring to FIGS. 4 and 5, the air intake opening 20 at the top of fin 1 lies between the outer air blade 22 of fin 1 and the outer air blade of adjacent fin. In this regard, it may be appreciated that air intake opening 20 extends vertically (i.e. downwardly) through the top of the folded heat conductive fin 1 so as to communicate with the primary air exhaust cavity 7 that runs horizontally (i.e. laterally) through the interior of fin 1 (also best shown in FIG. 3).

Turning now to FIGS. 4 and 5 of the drawings, there is shown a pair of folded heat conductive fins 1-1 and 1-2 which are identical to the heat conductive fin 1 that was just described while referring to FIGS. 1–3. The fins 1-1 and 1-2 are arranged face-to-face one another and form the first two heat conductive fins of the plurality of fins of the heat exchanger core (designated 30 in FIG. 6). Fins 1-1 and 1-2 are provided to illustrate the non-linear air flow paths that are created through the air intake openings 20-1 and 20-2 and the generally upper and lower primary and supplemental air exhaust cavities 7-1, 24-1 and 7-2, 24-2 of an adjacent pair of heat conductive fins of the folded fin heat exchanger core following the splitting of the supply of intake air that is pumped into the core by a suitable fan (designated 40 in FIGS. 8 and 9).

As described above, the intake air supply generated by the fan is pumped into the interior of the heat conductive fins 1-1 and 1-2 by way of the vertically extending air intake openings 20-1 and 20-2. Air intake openings 20-1 and 20-2 are located at the top of each fin and lie between a corresponding pair of outer air blades 22-1 and 22-2 that project from respective rear faces 5-1 and 5-2. A first portion of the intake air supply is guided downwardly through the vertically extending air intake opening 20-1 of the first fin 1-1 by the outer air blade 22-1 thereof. The first portion of the intake air supply that is pumped downwardly into the vertical air intake opening 20-1 will blow heat that is collected by the first heat conductive fin 1-1 into the atmosphere from opposite sides of fin 1-1 via the primary air exhaust cavity 7-1 that runs laterally through the interior thereof.

The remaining portion of the intake air supply that is generated by the fan will be pumped downwardly through the vertically extending air intake openings 20-1 and 20-2 and against the inner air blades 12-1 and 12-2 of the pair of heat conductive fins 1-1 and 1-2. The side flaps of the inner air blade 12-1 of the first fin 1-1 will focus the intake air along a concentrated stream to be diverted by inner air blade 12-1 into a generally lower supplemental air exhaust cavity 24-1 that communicates with air intake opening 20-1 through the opening (designated 10 in FIGS. 1–3) in the front face 3-1 of fin 1-1. The supplemental air exhaust cavity 24-1 is established between the front face 3-1 of the first fin 1-1 and the rear face 5-2 of the adjacent fin 1-2. Like the primary air exhaust cavity 7-1 of fin 1-1, the supplemental air exhaust cavity 24-1 has a triangular shape that runs laterally through the heat exchanger core. While one side of the triangular primary air exhaust cavity 7-1 between the front and rear faces 3-1 and 5-1 is formed by the closed flats 9-1 at the top of the first fin 1-1, one side of the triangular supplemental air exhaust cavity 24-1 between the rear face 5-2 of the second fin 1-2 and the front face 3-1 of the first fin 1-1 is formed by the flat base 11-1 that turns out from the front face 3-1 of fin 1-1. Accordingly, heat that is collected at the interface of the pair of adjacent folded heat conductive fins 1-1 and 1-2 will be blown into the atmosphere via the laterally extending supplemental air exhaust cavity 24-1.

It may be appreciated that the generally upper and lower, laterally extending primary and supplemental air exhaust cavities 7-1, 24-1 and 7-2, 24-2 of the adjacent pair of heat conductive fins 1-1 and 1-2 are disposed in parallel alignment with each other and in perpendicular alignment with the vertically extending air intake openings 20-1 and 20-2. It may also be appreciated that the volume of air that is exhausted to the atmosphere via each of the primary and supplemental air exhaust cavities 7-1, 24-1 and 7-2, 24-2 of the pair of adjacent fins 1-1 and is variably and selectively controlled by the angles at which the inner air blades 12-1 and 12-2 are bent towards the rear faces 5-1 and 5-2 and into the primary air exhaust cavities 7-1 and 7-2 of each fin.

Figure 6:
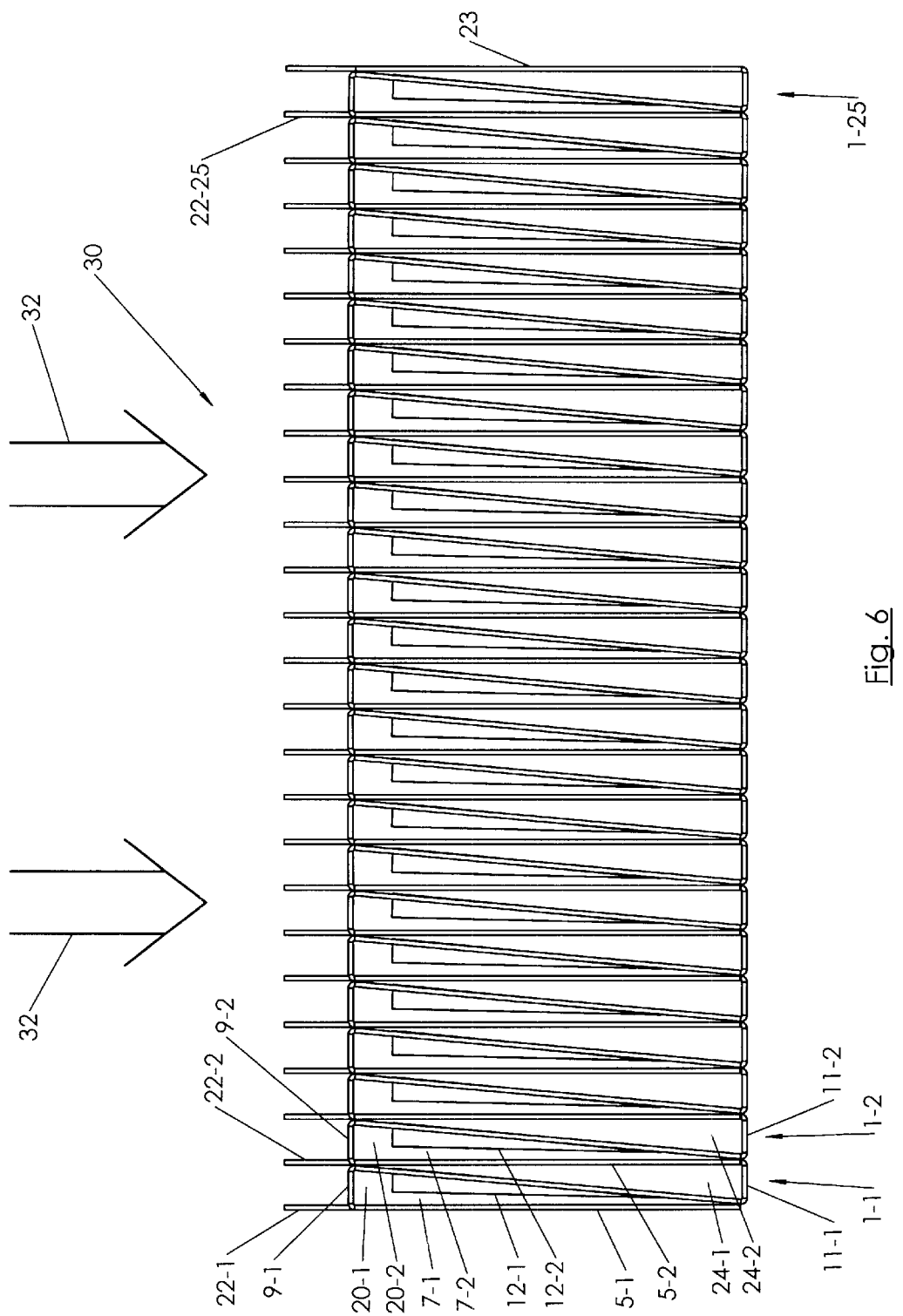
FIG. 6 shows a side view of the heat exchanger core comprising a plurality of the folded heat conductive fins aligned face-to-face one another.

FIG. 6 of the drawings shows the folded fin heat exchanger core 30 for the heat sink of this invention. As earlier disclosed, the core 30 is formed from a plurality of heat conductive fins that are folded in the manner shown in FIGS. 1–3 and arranged face-to-face one another in the manner shown in FIGS. 4 and 5. The heat exchanger core 30 of FIG. 6 has a total of 25 heat conductive fins. However, this number is for the purpose of example only, and it is to be understood that the number and size of the fins as well as the dimensions of the core 30 will depend upon the amount of heat to be dissipated and the type and capacity of the fan that is employed to pump the supply of intake air into the core.

FIG. 6 shows the face-to-face alignment of the heat conductive fins 1-1, 1-2 . . . 1-25 so as to form the folded fin heat exchanger core 30. An additional air blade 23 is attached to the last fin 1-25 to complete the core assembly. FIG. 6 also illustrates the generally upper and lower primary and supplemental air exhaust cavities (e.g. 7-1, 24-1 and 7-2, 24-2) that are established by successive pairs of the folded heat conductive fins (e.g. 1-1 and 1-2) to blow heat out the opposite sides of core 30 and into the atmosphere. As was disclosed above, an intake air supply 32 is blown by a suitable fan (40 in FIGS. 8 and 9) downwardly through the heat exchanger core 30 via the vertically extending air intake openings (e.g. 20-1 and 20-2) of fins 1-1 and 1-2 air intake openings 20-1 and 20-2 of fins 1-1 and 1-2 communicate with respective laterally extending primary and supplemental air exhaust cavities 7-1, 24-1 and 7-2, 24-2. Inasmuch as the vertically extending air intake openings 20-1 and 20-2 are arranged in perpendicular alignment with the laterally extending primary and supplemental air exhaust cavities 7-1, 24-1 and 7-2, 24-2, the intake air supply 32 is correspondingly redirected by heat conductive fins 1-1 and 1-2 so as to be blown through a non-linear flow path between the intake and output ends of core 30.

In particular, the downwardly directed intake air supply 32 through air intake openings 20-1 and 20-2 is split by the inner air blades (e.g. 12-1 and 12-2). That is, a first portion of the intake air supply 32 is directed downwardly along the upwardly projecting outer air blades 22-1 and 22-2 and the rear faces 5-1 and 5-2 of adjacent fins 1-1 and 1-2 to be exhausted from the opposite sides of heat exchanger core 30 via the laterally extending, generally upper primary air exhaust cavities 7-1 and 7-2. The remaining portion of the intake air supply 32 is directed downwardly through intake openings 20-1 and 20-2 and into contact with the inner air blades 12-1 and 12-2 of adjacent fins 1-1 and 1-2 so as to be diverted into the generally lower laterally extending supplemental air exhaust cavities 24-1 and 24-2 and exhausted to the atmosphere from opposite sides of the core 30. In this same regard, the top of the folded fin heat exchanger core 30 into which the intake air supply 32 is pumped is cooler than the bottom of core 30 which, in the heat sink configuration of FIG. 9, will lie above a central processing unit from which heat is collected and transferred to the atmosphere by way of the air exhaust cavities.

Figure 8:
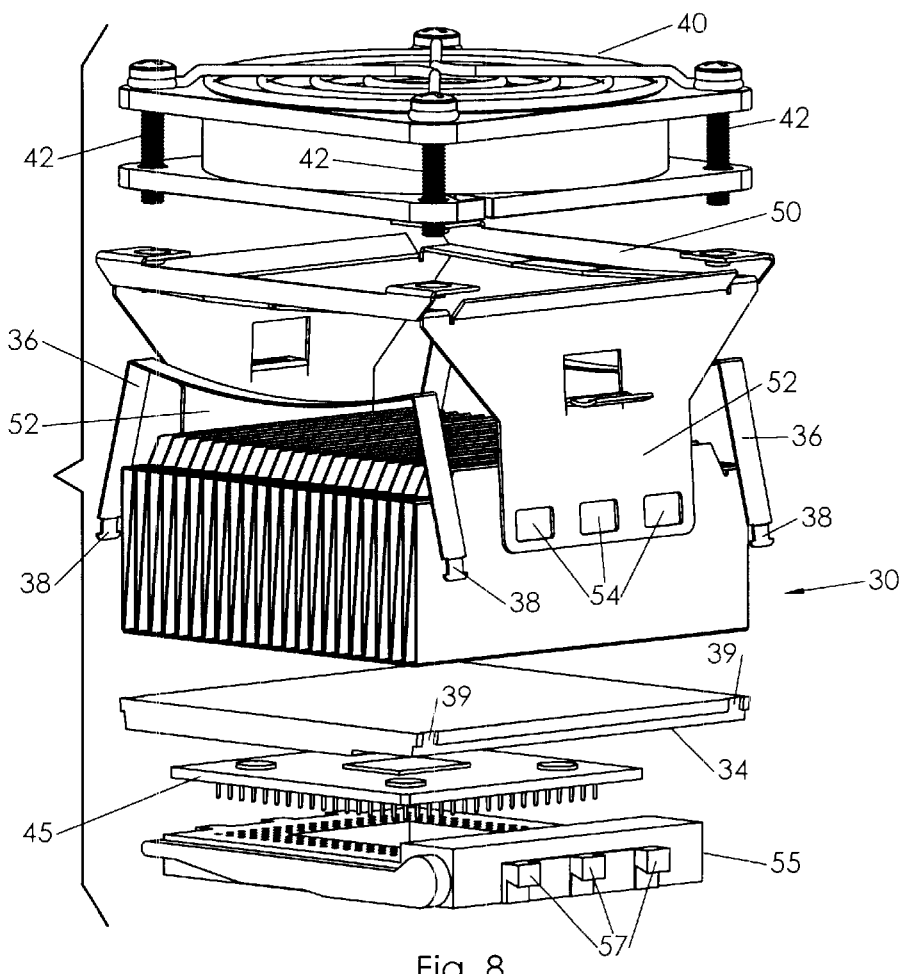
FIG. 8 is an exploded view showing the folded fin heat exchanger core of FIG. 7 arranged between a fan and a CPU from which heat is to be transferred and exhausted to the atmosphere.
Figure 9:
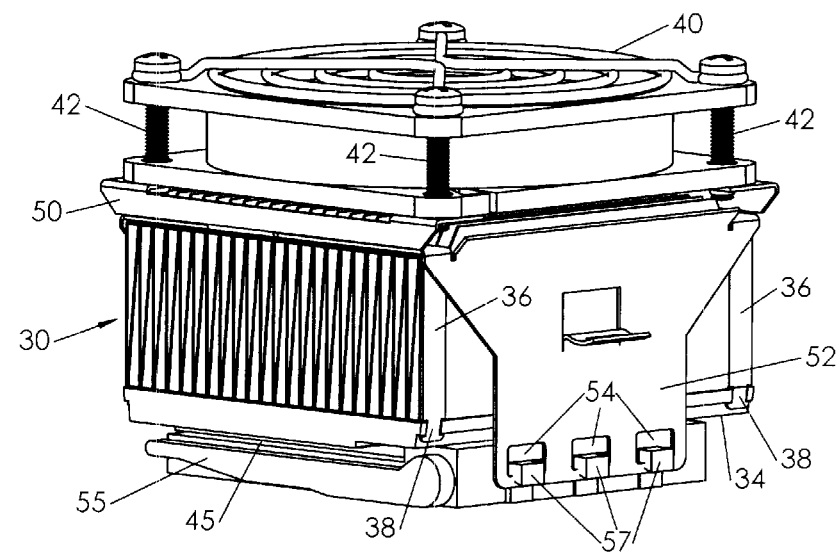
FIG. 9 shows the folded fin heat exchanger core of FIG. 8 in the assembled heat sink configuration.

By virtue of the folded fin heat exchanger core 30 of FIG. 6, the folded heat conductive fins 1-1, 1-2 . . . 1-25 will have more total surface area than will the fins that are associated with the cores of conventional heat sinks. Thus, the heat exchange efficiency of the core 30 will be correspondingly increased. Moreover, and as is best shown in FIGS. 8 and 9, the core 30 facilitates the integration of a suitable fan 40 directly above the heat sink without the necessity of including an additional space consuming fluid conduit interface. What is even more, the head pressure at the intake (i.e. top) end of heat exchanger core 30 will be reduced, while the flow length through core 30 will be shortened. Accordingly, the exhaust capability of the heat exchanger core 30 having the primary and supplemental air exhaust cavities communicating with opposite sides of the core will be effectively doubled relative to the exhaust capability of the core that has heretofor been used in the conventional heat sink.

Figure 7:
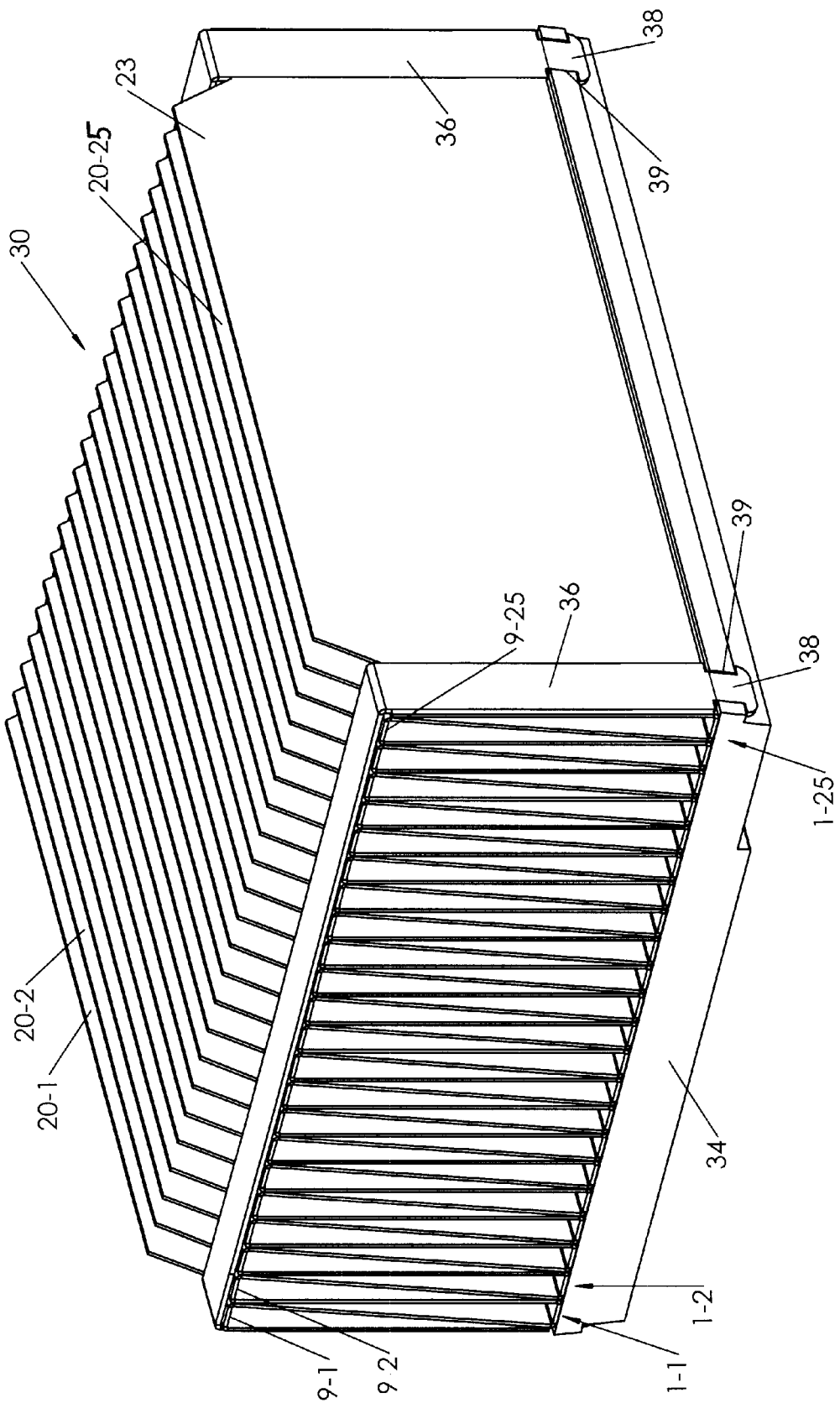
FIG. 7 shows the heat exchanger core of FIG. 6 strapped to a flat support plate.

FIG. 7 of the drawings shows the heat exchanger core 30 of FIG. 6 in the manner that it will be secured to a metal (e.g. copper or aluminum) support plate 34 in the assembled heat sink configuration of FIGS. 8 and 9. A pair of flexible U-shaped stainless steel tie-down straps 36 having locking tabs 38 projecting from each end thereof extend longitudinally over the core 30 and along the flat closed portions 9-1, 9-2 . . . 9-25 at the tops of heat conductive fins 1-1, 1-2 . . . 1-25. The straps 36 bend over the front and back of the core 30, whereby the locking tabs 38 of straps 36 are received and retained within respective locking notches 39 that are formed in opposite ends of support plate 34 so that a holding pressure is generated to secure the heat exchanger core 30 against the support plate 34.

Of course, the tie-down straps 36 could extend over the heat exchanger core 30 at locations other than the closed flat portions 9-1, 9-2 . . . 9-25, as shown. In addition, the core 30 could also be either soldered, brazed or welded to the support plate 34 which may obviate the requirement for hold down straps 36. However, in the case where straps 36 are used to secure the core 30 to the support plate 34 and thereby avoid the cost and time associated with soldering, brazing and welding, it has been found that adding a slightly curved (i.e. convex) force distribution edge (designated 25 and shown in phantom lines in FIG. 2) to the bottom of each heat conductive fin 1-1, 1-2 . . . 1-25 will advantageously concentrate the forces to which the fins are subjected towards the center of the core 30 where such forces may be more easily dissipated. More particularly, the force distribution edge 25 that will lie against the support plate 34 is an extension of the rear face 5 of a heat conductive fin 1 so as to project below the flat base 11 thereof. By way of example, the force distribution edge 25 of the fin 1 of FIG. 2 extends below the base 11 by about 0.005 inches at the midpoint thereof.

FIGS. 8 and 9 of the drawings show the folded fin heat exchanger core 30 of FIGS. 6 and 7 used in a heat sink application for the purpose of dissipating the heat that is generated by a conventional central processing unit (CPU) 45 of the type that is available from different manufacturers and commonly found in a computing device, such as a personal computer, or the like. In the heat sink application, a suitable (e.g. muffin) fan 40 is seated on a fan mount 50. The fan mount 50 has a pair of legs 52 depending downwardly therefrom. A set of windows 54 is formed in each leg 52. The CPU 45 is electrically connected to a well known Ziff socket 55 (best shown in FIG. 8). A set of catches 57 projects outwardly form opposite ends of socket 55. The metal support plate 34 that was previously described while referring FIG. 7 is laid over top of the socket 55 so as to cover the CPU 45.

As was also described while referring to FIG. 7, the folded fin heat exchanger core 30 is secured to support plate 34 by means of the U-shaped tie-down straps 36 and by moving the locking tabs 38 thereof into receipt by respective ones of the locking notches 39 of support plate 34. With the fan 40 attached by means of fasteners 42 to the fan mount 50, the legs 52 which depend downwardly from fan mount 50 are mated to socket 55 by means of locating the sets of catches 57 that project from opposite ends of socket 55 through respective windows 54 that are formed in the legs 52. Accordingly, and as is best shown in the assembled heat sink configuration of FIG. 9, the fan 40 is securely retained by fan mount 50 to lie immediately above the open top of the folded fin heat exchanger core 30 so that substantially all of the intake air supply that is produced by fan 40 will be blown downwardly and directly into the core 30 without a space consuming fluid conduit interface located therebetween. Thus, the heat generated by CPU 45 will be efficiently collected by heat exchanger core 30 and exhausted to the atmosphere through opposite sides of the core.

Because of the folded fin configuration, wherein the front and rear faces 3-1, 5-1 and 3-2, 5-2 of each successive pair of heat conductive fins (e.g. 1-1 and 1-2) of the heat exchanger core 30 are bent together to form triangular upper and lower primary and supplemental air exhaust cavities 7-1, 24-1 and 7-2, 24-2, a heat sink will now be available having as much as twice the material and surface area when compared to conventional heat sinks without increasing the volume of the core. Thus, the volume of air flow is optimized and the correspondng amount of heat that can be exhausted to the atmosphere by the folded fin heat exchanger core 30 herein described is maximized relative to the cores of conventional heat sinks without increasing the size of core 30 beyond PC size restrictions. In this same regard, and unlike skived heat sinks, the heat sink configuration of this invention can be fully scaled in all directions. What is even more, the individual folded fins (e.g. 1-1 and 1-2) also function as load bearing structures for supporting components in this and other applications. Thus, with the heat exchanger core 30 secured to the support plate 34 as best shown in FIG. 7, the overall mechanical strength of the core is enhanced so as to be able to withstand top and side crushing forces.

It is also within the scope of this invention to invert the fan 40 so that it is turned upside down with respect to its orientation with the heat exchanger core 30 shown in FIGS. 8 and 9. In this case, instead of blowing cool fan air to the CPU 45 through the open top of core 30, the heat emitted from CPU 45 will now be suctioned to the atmosphere through the open top of the core. The structure of the core 30, however, need not be changed to accommodate this inverted fan orientation.

I claim:

1. A heat sink to dissipate heat that is generated by a source, said heat sink comprising a core including a plurality of heat conducting fins to collect the heat generated by the source, each fin of said plurality of heat conducting fins having a front face, a back face spaced rearwardly from said front face, an air exhaust cavity located between said front and back faces, an inner air blade removed from said front face and bent rearwardly from said front face towards said back face so as to lie within said air exhaust cavity, a top connected between said front and back faces, and an air intake opening formed through said top to receive a supply of fan air therethrough, a portion of the fan air received through said air intake opening being diverted from said air exhaust cavity by said inner air blade, said air exhaust cavity extending between said air intake opening and the atmosphere so that the heat generated by the source and collected by said fin is blown into the atmosphere by the supply of fan air which is not being diverted from said air exhaust cavity by said inner air blade.

2. The heat sink recited in claim 1, wherein said air intake opening through the top of each fin of said plurality of heat conducting fins extends in a vertical direction and said air exhaust cavity between the front and back faces of said fin extends in a horizontal direction, said vertically extending air intake opening communicating with said horizontally extending air exhaust cavity in perpendicular alignment therewith.

3. The heat sink recited in claim 1, wherein each fin of said plurality of heat conducting fins also has a pair of opposite sides that are open to the atmosphere, said air exhaust cavity located between said front and back faces and extending laterally between said pair of opposite sides, such that the heat that is generated by the source and collected by said fin is exhausted to the atmosphere from each of the open opposite sides thereof.

4. The heat sink recited in claim 3, wherein said air exhaust cavity that is located between the front and back faces and extends laterally between the open opposite sides of each fin of said plurality of heat conducting fins has a triangular shape.

5. The heat sink recited in claim 4, wherein the bottoms of said front and back faces of each fin of said plurality of heat conducting fins engage one another so as to establish said triangular air exhaust cavity that is located between the front and back faces and extends laterally between the open opposite sides of said fin.

6. The heat sink recited in claim 1, wherein each fin of said plurality of heat conducting fins also has an air transfer opening in said front face thereof, said air transfer opening formed by said inner air blade being removed from said front face and bent rearwardly towards said back face, the portion of the supply of fan air received through said air intake opening at the top of said fin being intercepted by said inner air blade and diverted from said air exhaust cavity to another one of said plurality of heat conducting fins by way of said air transfer opening.

7. The heat sink recited in claim 6, wherein each fin of said plurality of heat conducting fins also includes a base projecting outwardly from the front face thereof so as to engage the back face of said another one of said plurality of heat conducting fins to thereby establish a supplemental air exhaust cavity between the front face and the back face of a pair of adjacent fins that are aligned face-to-face one another, whereby said portion of fan air that is intercepted by said inner air blade is diverted into said supplemental air exhaust cavity to be exhausted to the atmosphere.

8. The heat sink recited in claim 1, wherein each fin of said plurality of heat conducting fins also includes an outer air blade projecting upwardly from said back face thereof so as to extend above said front face, said outer air blade guiding the supply of fan air for receipt through said air intake opening at the top of said fin into said air exhaust cavity located between the front and back faces of said fin.

9. A heat sink to dissipate heat generated by a source, said heat sink comprising a core including a plurality of adjacent heat conducting fins to collect the heat generated by the source, a support plate located between said core and the source of heat, and tie-down straps surrounding said core and connected to said support plate so as to hold said core against said support plate, and wherein each fin of said plurality of adjacent heat conducting fins having a front face, the bottom of said front face having a curved force-distributing edge aligned to engage the support plate against which said core is held, a back face, open opposite sides, an air exhaust cavity located between said front and back faces and extending laterally between said open opposite sides, a top connected between said front and back faces, and an air intake opening extending vertically through said top for receiving a supply of fan air therethrough and communicating with said laterally extending air exhaust cavity, said vertically extending air intake opening and said laterally extending air exhaust cavity of each fin of said plurality of adjacent heat conducting fins forming non-linear air flow paths through said core by which the heat generated by the source is transferred through said support plate to be collected by said plurality of adjacent heat conducting fins and blown by the fan air into the atmosphere through the open opposite sides of said fins.

10. The heat sink recited in claim 8, wherein said vertically extending air intake opening and said laterally extending air exhaust cavity of each fin of said plurality of adjacent heat conducting fins are aligned perpendicularly relative to one another.

11. The heat sink recited in claim 9, wherein said air exhaust cavity that is located between the front and back faces and extends laterally between the open opposite sides of each fin of said plurality of adjacent heat conducting fins has a triangular shape.

12. The heat sink recited in claim 11, wherein the bottoms of said front and back faces of each fin of said plurality of adjacent heat conducting fins engage one another so as to establish said triangular air exhaust cavity that is located between the front and back faces and extends laterally between the open opposite sides of said fin.

13. The heat sink recited in claim 9, wherein each fin of said plurality of adjacent heat conducting fins also has an inner air blade cut from said front face thereof and bent rearwardly towards said back face so as to lie within said air exhaust cavity that is located between said front and back faces and extends laterally between the open opposite ends of said fin.

14. The heat sink recited in claim 13, wherein each fin of said plurality of adjacent heat conducting fins also has an opening in said front face thereof, said opening formed by said inner air blade being cut from said front face and bent rearwardly towards said back face, a portion of the supply of fan air received through said air intake opening at the top of said fin being intercepted by said inner air blade and diverted to the adjacent one of said plurality of adjacent heat conducting fins by way of said opening.

15. The heat sink recited in claim 14, wherein each fin of said plurality of adjacent heat conducting fins also includes a base projecting outwardly from the bottom of the front face thereof so as to engage the back face of the adjacent fin to thereby establish a supplemental air exhaust cavity between the front face and the back face of the pair of adjacent fins, whereby said portion of fan air that is intercepted by said inner air blade is diverted into said supplemental air exhaust cavity to be exhausted to the atmosphere.

16. The heat sink recited in claim 9, wherein each fin of said plurality of adjacent heat conducting fins also includes an outer air blade projecting upwardly from said back face thereof so as to extend above said front face, the supply of fan air being blown between the outer air blades of a pair of adjacent fins for receipt through the air intake opening at the top of one of said pair of fins.

17. A heat sink to dissipate heat that is generated by a source, said heat sink comprising a core including a plurality of adjacent heat conducting fins to collect the heat generated by the source, each fin of said plurality of adjacent heat conducting fins having a front face, an air transfer opening formed through said front face, a back face spaced from said front face, a top connected between said front and back faces, an air intake opening formed through said top to receive a supply of fan air therethrough, a primary air exhaust cavity lying between said front and back faces and extending from said air intake opening to the atmosphere, and a supplemental air exhaust cavity lying between the front face of a first of said plurality of heat conducting fins and the back face of an adjacent fin, such that a first portion of the supply of fan air received through the air intake opening at the top of said first fin is delivered to said primary air exhaust cavity and the remaining portion of the supply of fan air received through said air intake opening is delivered to said supplemental air exhaust cavity by way of said air transfer opening formed in the front face of said first fin.

18. The heat sink recited in claim 17, wherein each fin of said plurality of adjacent heat conducting fins includes an air splitter located within said primary air exhaust cavity to intercept the supply of fan air received through said air intake opening, said air splitter dividing the supply of fan air such that the first portion of the fan air is delivered to said primary air exhaust cavity and the remaining portion of the fan air is delivered to said supplemental air exhaust cavity by way of said air transfer opening through said front face.

19. The heat sink recited in claim 18, wherein each fin of said plurality of adjacent heat conducting fins has an air blade aligned with said air transfer opening in said front face, said air blade lying within said primary air exhaust cavity to establish said air splitter.

20. The heat sink recited in claim 17, wherein each fin of said plurality of adjacent heat conducting fins includes a base projecting outwardly from the front face thereof so as to engage the back face of an adjacent one of said plurality of heat conducting fins, whereby the supplemental air exhaust cavity is established between the front face and the back of a pair of adjacent fins.

* * * * *